United States Patent
Jayaraman et al.

(10) Patent No.: US 7,967,942 B2
(45) Date of Patent: Jun. 28, 2011

(54) POLYMER MATRICES FOR POLYMER SOLDER HYBRID MATERIALS

(75) Inventors: Saikumar Jayaraman, Chandler, AZ (US); Paul A. Koning, Chandler, AZ (US); Ashay Dani, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 551 days.

(21) Appl. No.: 11/825,400

(22) Filed: Jul. 6, 2007

(65) Prior Publication Data

US 2007/0251639 A1     Nov. 1, 2007

Related U.S. Application Data

(62) Division of application No. 10/358,526, filed on Feb. 4, 2003, now Pat. No. 7,252,877.

(51) Int. Cl.
- C04B 37/00     (2006.01)
- H01L 23/34    (2006.01)
- B32B 5/16     (2006.01)
- B32B 27/08    (2006.01)

(52) U.S. Cl. ......... 156/325; 257/715; 428/328; 428/517

(58) Field of Classification Search ................... 156/325; 257/715; 428/328, 517
See application file for complete search history.

(56) References Cited

U.S. PATENT DOCUMENTS

| | | | |
|---|---|---|---|
| 3,574,770 A * | 4/1971 | Stump et al. | 568/615 |
| 4,869,954 A | 9/1989 | Squitieri | |
| 5,545,473 A | 8/1996 | Ameen et al. | |
| 6,339,120 B1 | 1/2002 | Misra et al. | |
| 6,451,422 B1 | 9/2002 | Nguyen | |
| 6,926,955 B2 | 8/2005 | Jayaraman et al. | |
| 2003/0178720 A1 | 9/2003 | Rumer et al. | |
| 2003/0203188 A1 | 10/2003 | Bunyan | |
| 2003/0234074 A1 | 12/2003 | Bhagwagar | |
| 2004/0081843 A1 | 4/2004 | Bunyan | |

* cited by examiner

*Primary Examiner* — Philip C Tucker
*Assistant Examiner* — Michael N Orlando
(74) *Attorney, Agent, or Firm* — Blakely, Sokoloff, Taylor & Zafman LLP

(57) ABSTRACT

Embodiments of the present invention provide various polymeric matrices that may be used as a binder matrix for polymer solder hybrid thermal interface materials. In alternative embodiments the binder matrix material may be phophozene, perfluoro ether, polyether, or urethane. For one embodiment, the binder matrix is selected to provide improved adhesion to a variety of interfaces. For an alternative embodiment the binder matrix is selected to provide low contact resistance. In alternative embodiments, polymeric materials containing fusible and non-fusible particles may be used in application where heat removal is desired and is not restricted to thermal interface materials for microelectronic devices.

3 Claims, 7 Drawing Sheets

CATALYST + HEAT

POLYMER MATRICES FOR POLYMER SOLDER HYBRID MATERIALS

This is a Divisional application of Ser. No. 10/358,526 filed Feb., 4, 2003, now U.S. Pat. No. 7,252,877.

FIELD

Embodiments of the invention relate generally to the field of thermal interface material (TIM) for thermally coupling electronic components to thermally conductive members, and more specifically to alternative low modulus polymer matrices for polymer solder hybrid (PSH) materials.

BACKGROUND

Integrated circuits are typically manufactured on semiconductor wafers that are then sawed (diced) into individual die. Typical microelectronic devices experience internal heating during operation that may reach a level such that the device no longer functions properly. To avoid such overheating, the die package may be thermally coupled to heat dissipation hardware (e.g., a heat sink and/or heat spreader). Attaching a heat sink to the die package requires that two solid surfaces be brought into intimate contact. The solid surfaces are not smooth enough to allow the desired contact. This is due to the microscopic hills and valleys of the solid surfaces as well as to macroscopic non-planarity in the form of a concave, convex, or twisted shape. As two such solid surfaces are brought together, only a small percentage of the surfaces make physical contact, with the remainder separated by a layer of interstitial air. Some heat is conducted from the die through the points of physical contact, but the majority must be transferred through the interstitial air layer. Since air is a relatively poor thermal conductor, the interstitial air layer is replaced with a TIM to increase the joint thermal conductivity and thus improve heat flow across the interface. The TIM brings the die package into good thermal contact with the heat dissipation hardware.

Various types of thermally conductive materials may be used as the TIM to eliminate air gaps from the interface including greases, reactive compounds, elastomers, and pressure sensitive adhesive films. TIMs are designed to conform to surface irregularities, thereby eliminating air voids, thus improving heat flow through the interface.

FIGS. 1A and 1B illustrate an exploded view of TIMs used in a typical microelectronic device in accordance with the prior art. As shown in FIG. 1A, a die package 105 mounted on a printed circuit board (PCB) 110 coupled by TIM 115 to a heat dissipation device, shown as heat sink 120. The heat sink 120 is typically aluminum and has fins as shown. The heat sink 120 may also include a fan, not shown (active heat sink). TIM 115 brings the die package 105 into intimate contact with the heat sink 120.

As shown in FIG. 1B, the microelectronic device may include a heat spreader 116 to improve the efficiency of heat transfer from the die package 105 to the heat sink 120. For such a device, a first TIM 115 may be used to improve thermal contact between the die package 105 and the heat spreader 116. A second TIM 117 may be used to improve contact between the heat spreader 116 and the heat sink 120.

FIG. 2 illustrates an arrangement of a non-fusible particle filler material within the polymer matrix of a TIM in accordance with the prior art. The polymer matrix may be a material that can be applied as a paste such as a dispensable syringe or by screen-printing. The polymer matrix may also act as an adhesive to bond the two mating parts together. The non-fusible particles, such as most metals, benefit from a high thermal conductivity, however a thermal flow path through the TIM is limited by the point-to-point contact of the particles as shown by the arrows. Non-fusible particles refer to particles that will not melt and flow during packaging assembly process, reliability testing, and product operation and so remain as point contacts with each other. This provides thermal conductivity through the TIM that is limited to point-to-point percolation, resulting in a thermal bottleneck through the non-fusible particles.

The phenomenon of percolation describes the effects of interconnections present in a random system, here the number of filler particles that are randomly in point contact with each other to allow thermal conduction. Normally, to improve conduction limited by percolation, the amount of filler could be increased until a threshold amount is reached and heat conduction, due to the filler, transitions to a sufficiently high value. The degree of filler required to reach this transition level may be too high and can overpower the properties desired from the polymer binder such as low contact resistance. Another problem is that for some metal particles in contact with some polymer binders, the bare particle filler can poison the polymer cure such as by hindering or blocking the curing agent.

To address these concerns, a PSH TIM has been developed that includes fusible particles as well as filler particles in a silicone polymer matrix material. The fusible particles melt during the assembly process and can therefore wet the filler particles or self-coalesce. Thereby the average particle size grows creating long continuous heat transfer pathways that alleviate the thermal bottleneck of percolation. The fusible particles may be materials such as solder-like materials that melt below approximately 300° C. The filler particles may be non-fusible materials with melting points well above 300° C., such as aluminum at 660° C., silver at 961° C., copper at 1084° C., gold at 1064° C., etc.

Silicone exhibits certain characteristics (e.g., low glass transition temperature and low moisture absorbency) that make it suitable as a binder matrix for PSH TIMs. For purposes of this disclosure, low glass transition temperature is approximately 25° C. and low moisture absorbency is approximately 1% or less by weight. Other materials may exhibit such characteristics and therefore may likewise be suitable as a binder matrix for PSH TIMs. Such materials may provide better adhesion and lower contact resistance than silicones and similar materials.

BRIEF DESCRIPTION OF THE DRAWINGS

The invention may be best understood by referring to the following description and accompanying drawings that are used to illustrate embodiments of the invention. In the drawings.

DETAILED DESCRIPTION

Overview

Embodiments of the present invention provide various polymeric matrices that may be used as a binder matrix for PSH TIMs. For one embodiment, the binder matrix is selected to provide improved adhesion to a variety of interfaces. For an alternative embodiment the binder matrix is selected to provide low contact resistance. In alternative embodiments, polymeric materials containing fusible and non-fusible particles may be used in application where heat removal is desired and is not restricted to TIM for microelectronic devices.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1A:
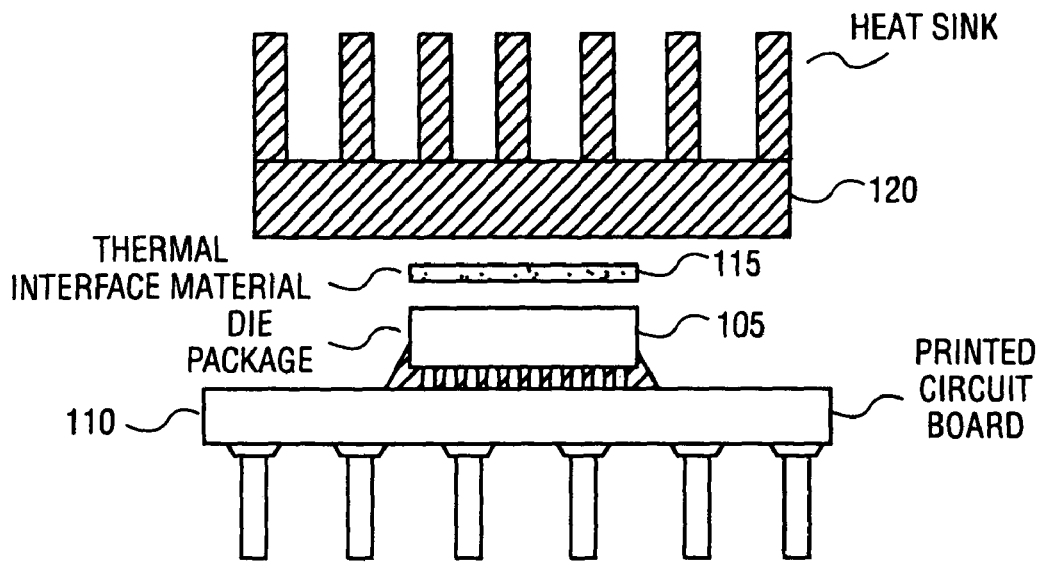
FIGS. 1B and 1B illustrate an exploded view of TIMs used in a typical microelectronic device in accordance with the prior art.
Figure 1B:
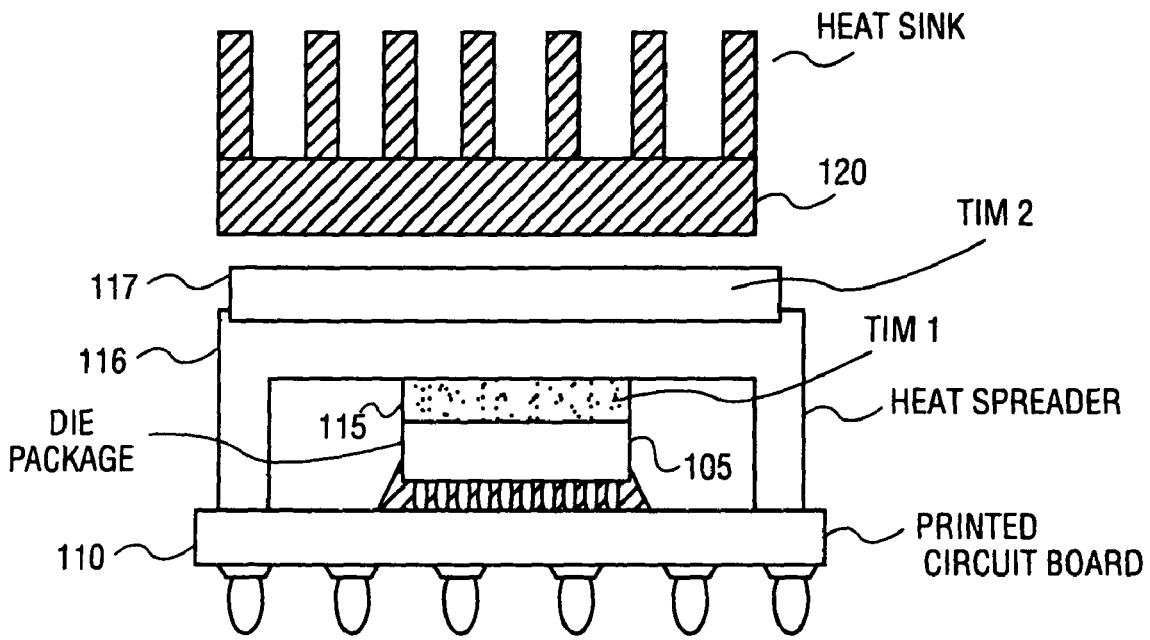
Figure 2:
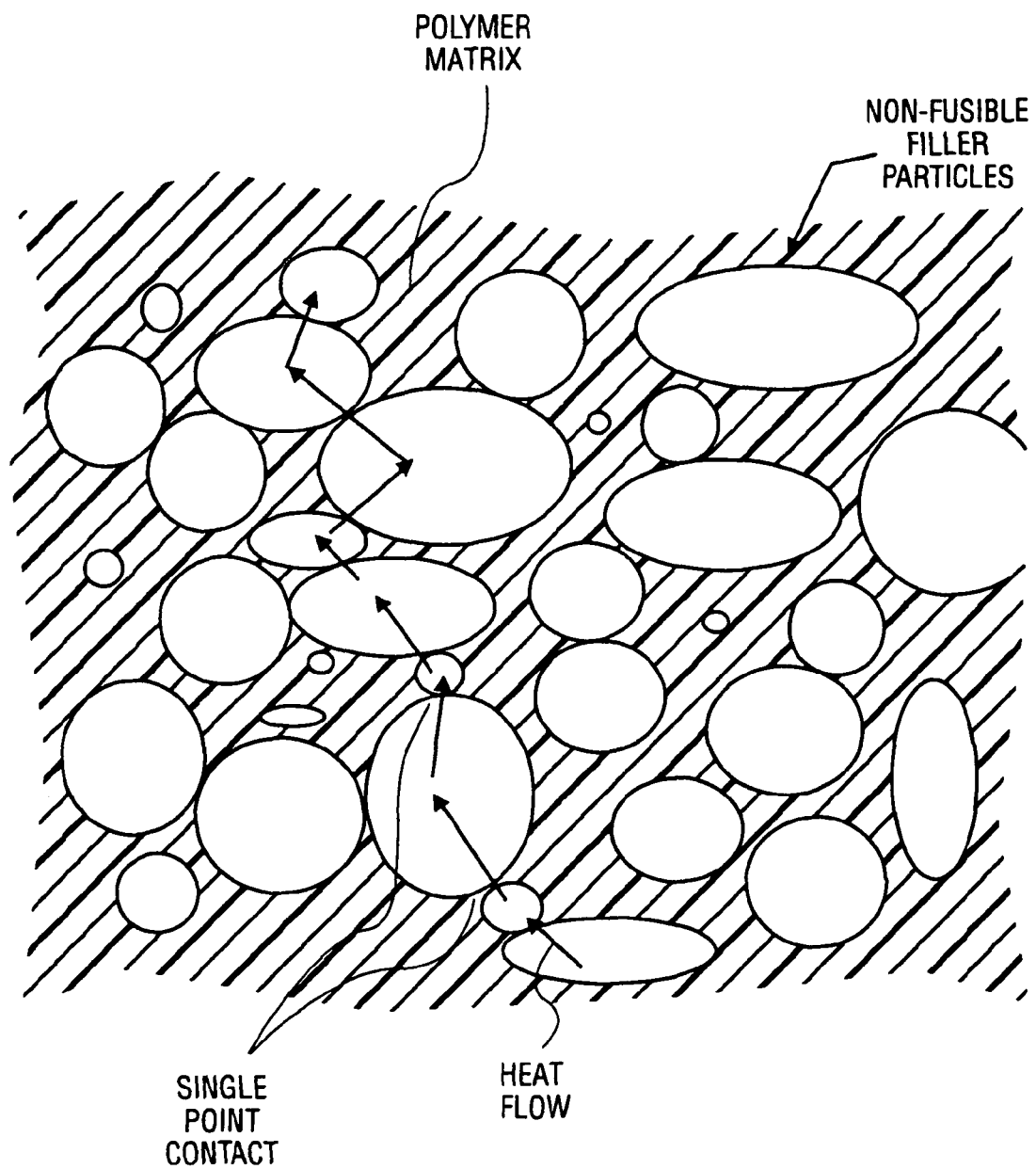
FIG. 2 illustrates an arrangement of a non-fusible particle filler material within the polymer matrix of a TIM in accordance with the prior art.
Figure 3:
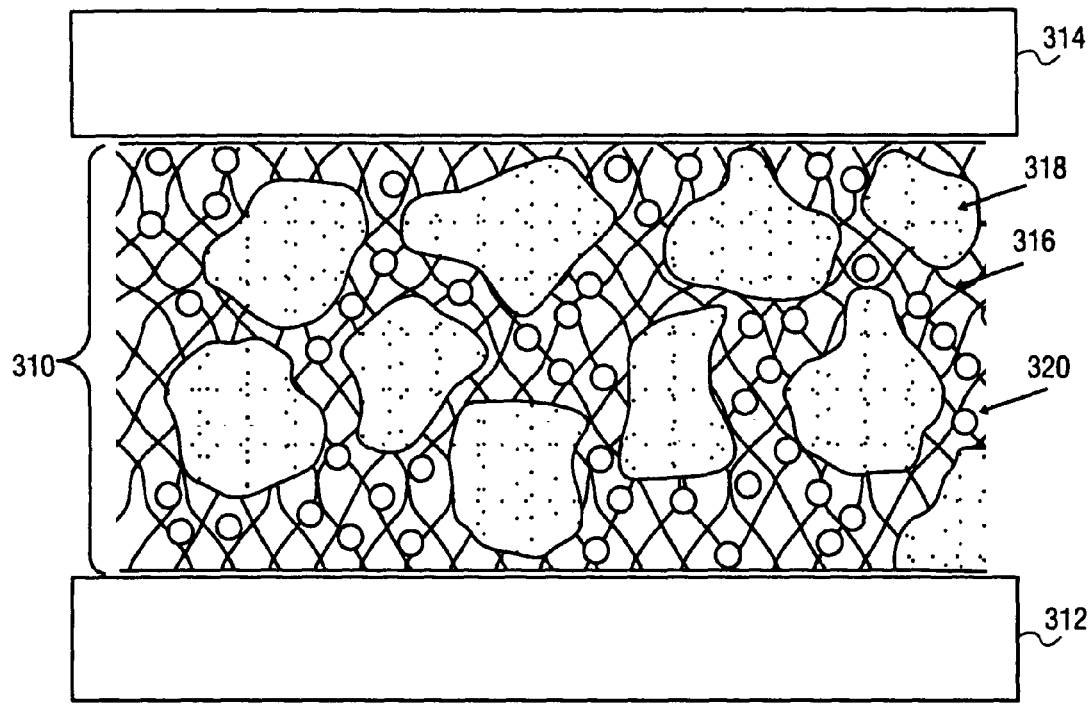
FIG. 3 illustrates a TIM that is inserted between and used for thermal coupling of an electronic component to a thermally conductive member in accordance with one embodiment of the invention.

FIG. 3 illustrates a TIM that is inserted between and used for thermal coupling of an electronic component 312 to a thermally conductive member 314 in accordance with one embodiment of the invention. The thermal interface material 310 includes a polymer matrix material 316, fusible solder particles 318 in the matrix material 316, and filler particles 320 in the matrix material 316. The solder particles 318 have a melting temperature below a selected temperature and the filler particles 320 have a melting temperature above the selected temperature. The solder particles 318 will thus melt when the temperature increases to above the selected temperature but the filler particles 320 will not melt.

The matrix material 316 may comprise between 1% and 10% of the thermal interface material 310 by weight and preferably comprises approximately 8% by weight.

The solder particles 318 may comprise between 1% and 99% of the thermal interface material 310 by weight, preferably at least 5% by weight, and more preferably between 25% and 90% by weight.

The solder particles 318 preferably have a melting temperature of between 60° C. and 300° C. The solder particles 318 may be made of pure solder compositions such as indium (In) with a melting temperature of 157° C. or a solder alloy, indium tin (InSn) with a eutectic melting temperature of 118° C., indium silver (InAg) with a eutectic melting temperature of 139° C., tin silver (SnAg) or tin silver copper (SnAgCu) with a eutectic melting temperatures of 217° C., tin bismuth (SnBi) with a eutectic melting temperature of 203° C., indium tin bismuth (InSnBi) with a melting temperature of between 60° C. and 140° C., indium titanium (InTi), indium zirconium (InZr), indium titanium cerium selenium (InTiCeSe), indium silver titanium cerium selenium (InAgTiSeCe), with melting temperatures between 145° C. to 165° C., etc.

The solder particles 318 may have diameters of between 0.2 and 100. The solder particles 318 may be a mixture of fine and coarse particles. In alternative embodiments, the solder particles may be any of various shapes including solder shavings.

The filler particles 320 may comprise between 0% or 95% of the thermal interface material 310 by weight, more preferably at least 10% by weight.

The solder particles 318 and the filler particles 320 together preferably comprise between 50% and 99% of the thermal interface material 310 by weight, and preferably comprise approximately 92% by weight.

The filler particles 320 (either fusible, non fusible or ceramic particles) preferably have a melting temperature above 350° C. and more preferably between 800° C. and 1200° C. The filler particles 320 preferably have a melting temperature that is at least 100° C., more preferably at least 200° C. above a melting temperature of the solder particles 318. The filler particles 320 may be nickel (Ni), copper (Cu) with a melting temperature of 1084° C., silver (Ag) with a melting temperature of 961° C., silver copper (Ag/Cu), tin (Sn), and graphite, and preferably are aluminum (Al) with a melting temperature of 660° C. Example of non-fusible fillers would be boron nitride, aluminum nitride, silicon carbide, aluminum oxide, graphite, carbon fiber, carbon nanotubes or diamond particles.

The matrix material 316 may be a phosphozene, a polyether, a urethane or a perfluoroether.

Figure 4:
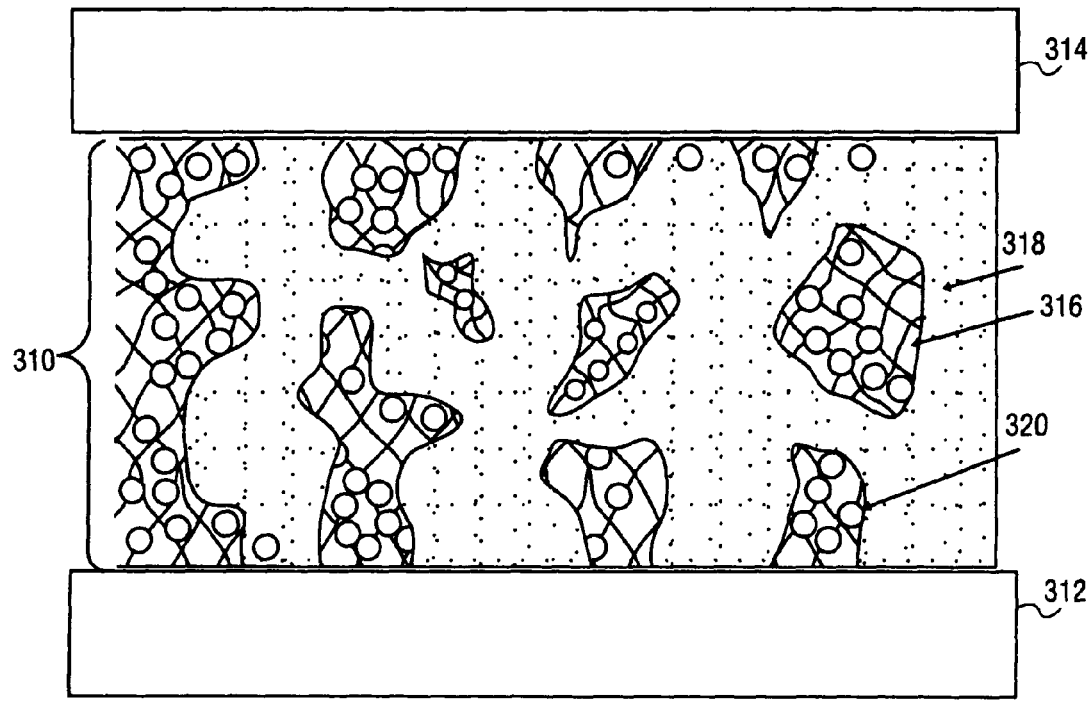
FIG. 4 illustrates the agglomeration of the fusible solder particles in accordance with one embodiment of the invention.

The whole assembly, including the electronic component 312, the thermally conductive member 314 and the thermal interface material 310 is inserted into a furnace which heats the assembly from room temperature to a temperature above which the solder particles 318 melt. For example, the composition is heated from room temperature of about 30° C. to approximately 170° C., which is above the melting temperature of the solder particles so that the solder particles 318 melt. The solder particles 318 fuse and agglomerate together. FIG. 4 illustrates the agglomeration of the fusible solder particles in accordance with one embodiment of the invention. The temperature to which the assembly is heated is, however, maintained below a temperature at which the filler particles 320 melt. For example, the composition is maintained at 170° C. for approximately two minutes, (i.e. until sufficient agglomeration has occurred). The assembly is then cooled to a temperature below the melting temperature of the solder particles 318 so that they solidify. For example, the composition is then cooled to a temperature of approximately 125° C. which is below the solder material's melting point and the solder particles solidify. The temperature is further lowered to a selected temperature above room temperature at which the matrix material 316 cures. Cross-linking may occur between polymer chains of the matrix material 316 while it is being cured to enhance the viscoelastic properties of the matrix material 316. The curing time and temperature are related and vary with the type of polymer binder matrix.

The temperature is then further lowered to room temperature. In the resulting structure, the solder particles 318 are agglomerated together and have large surfaces contacting both the electronic component 312 and the thermally conductive member 314 so as to provide an unbroken path through which heat can conduct from the electronic component 312 through the now consolidated solder particles 318 to the thermally conductive member 314. The matrix material 316 has the ability to absorb stresses on the material. However, without the filler particles 320, the thermal interface material 310 may tend to flow out from between the electronic component 312 and the thermally conductive member 314 during thermal cycling and/or when exposed to high humidity. The filler particles 320 provide the necessary strength to prevent such flow. The filler particles 320 thus keep the thermal interface material 310 intact during adverse stress and thermal conditions.

Alternative Polymer Matrices

The polymer matrix material may be selected for various characteristics. Typically these characteristics include low, low moisture absorbency, adhesion to a variety of interfaces, low contact resistance, or combinations thereof. Several polymer matrices have been identified that exhibit one or more of the above-noted characteristics and are considered suitable as a binder matrix for PSH TIMs.

Phosphozene

Figure 5:
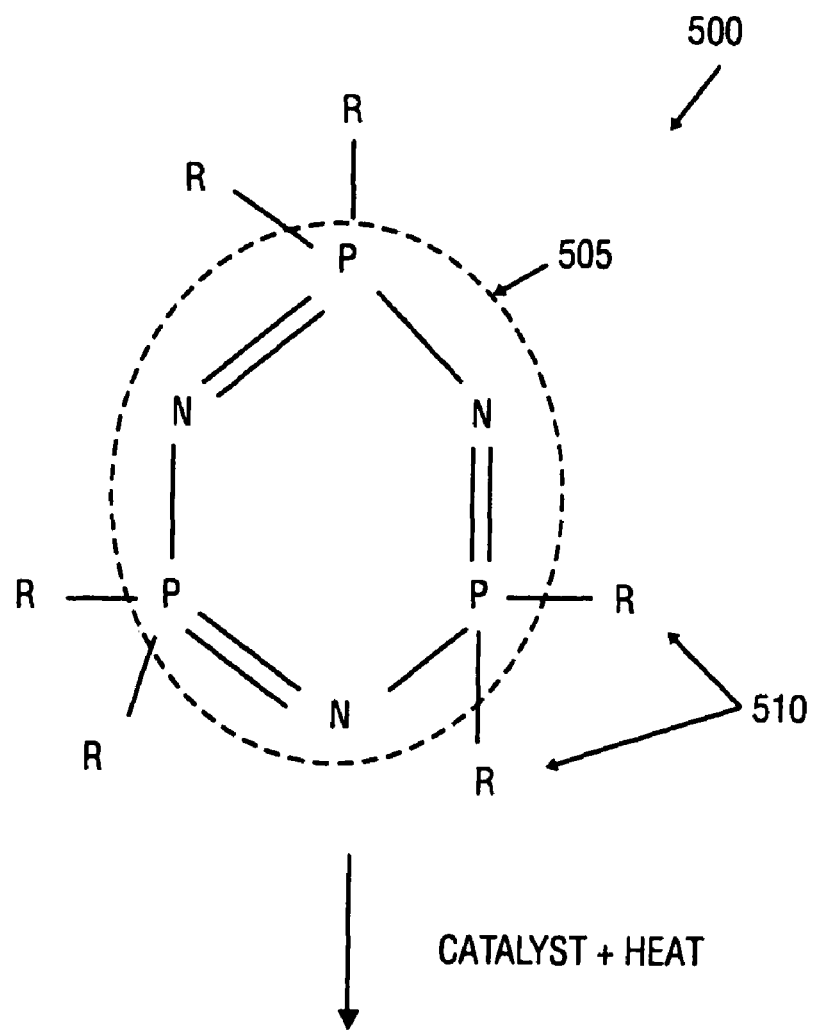
FIG. 5 illustrates the structure of phosphozene indicating suitability as a binder matrix for PSH TIMs.
Figure 5:
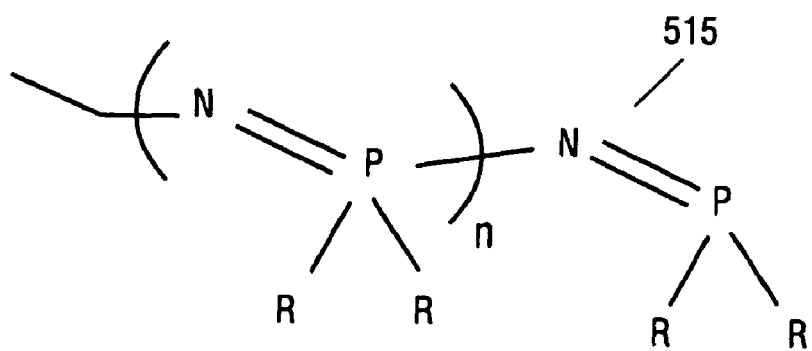

Phosphozenes are elastomeric materials (polymers with elastic properties similar to natural rubber). Phosphozenes are a low glass transition temperature, low modulus (approximately 1 Gpa or less), materials that are thermally stable. FIG. 5 illustrates the structure of phosphozene 500 indicating suitability as a binder matrix for PSH TIMs. As shown in FIG. 5, phosphozene structure 500 includes a phosphorous/nitrogen backbone 505 with attached substituents R 510 (where R may be, for example, $OCH_3$, Oet, Oalkyl, Operfluoroalkyl, etc.). Phosphozenes are similar to siloxanes, but are more polar. This characteristic provides good wetting of the interfaces and therefore lower contact resistance. The phosphorous and nitrogen, present in the backbone provide improved adhesion, as well.

Moreover, the moisture absorbency of the polymer can be adjusted by manipulation of the R-groups so it is possible to obtain a low moisture absorbency binder matrix as desired.

Upon application of a catalyst and heat, phosphozene polymerizes (structure 515) like silicone, although the structure is different.

Perfluoro Ether Resin

Figure 6A:
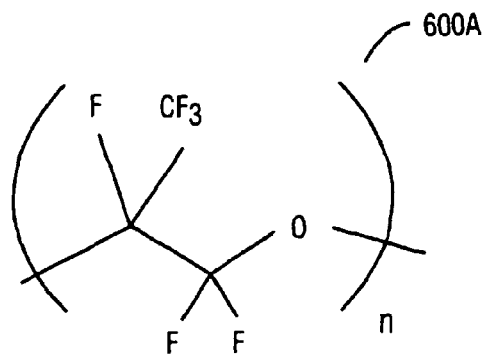
FIGS. 6A and 6B illustrate the structure of perfluoro ether resin indicating suitability as a binder matrix for PSH TIMs.
Figure 6B:
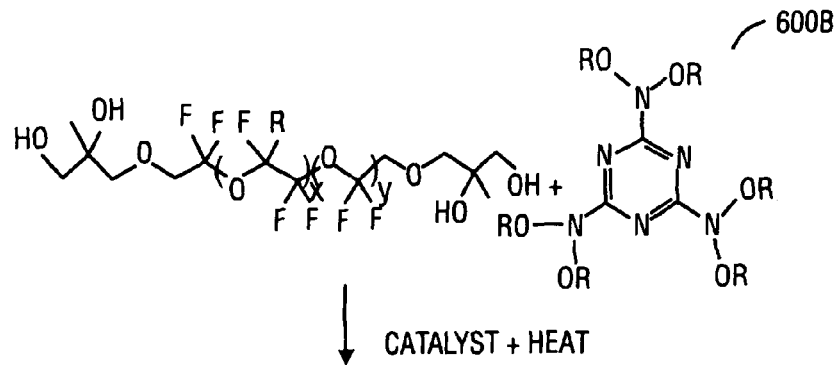
Figure 6B:
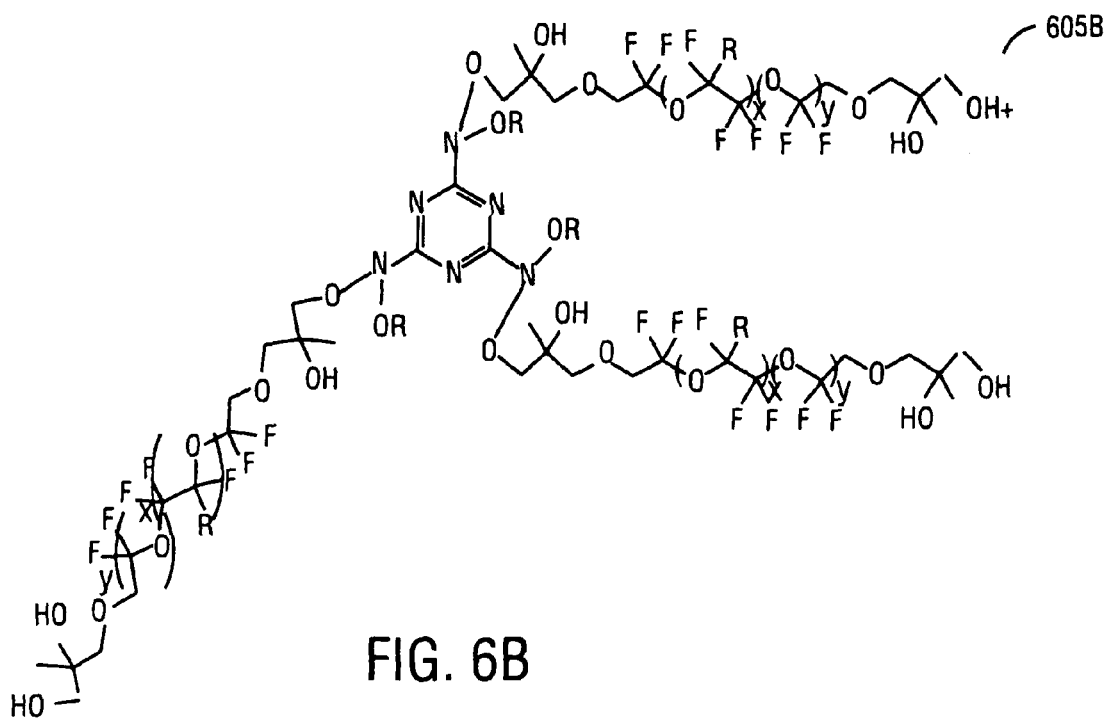

Perfluoro ether resin is another resin type that likewise exhibits desirable characteristics for application as a PSH TIM. FIGS. 6A and 6B illustrate the structure of perfluoro ether resin indicating suitability as a binder matrix for PSH TIMs. FIG. 6A illustrates an example of a perfluoro ether resin, namely polyperfluoro propylene oxide resin, structure 600A. Perfluoro ether resins are elastomeric with low surface energy, as well as thermally stable. Additionally, perfluoro ether resins can be designed to have low moisture absorbency and be cross-linkable as shown in FIG. 6B. Structure 600B shows an example of cross-linkable perfluoro ether resin. Structure 605B is the cross-linked structure created by subjecting the perfluoro ether resin to a catalyst and heat.

Polyether-Based Resin

Figure 7A:
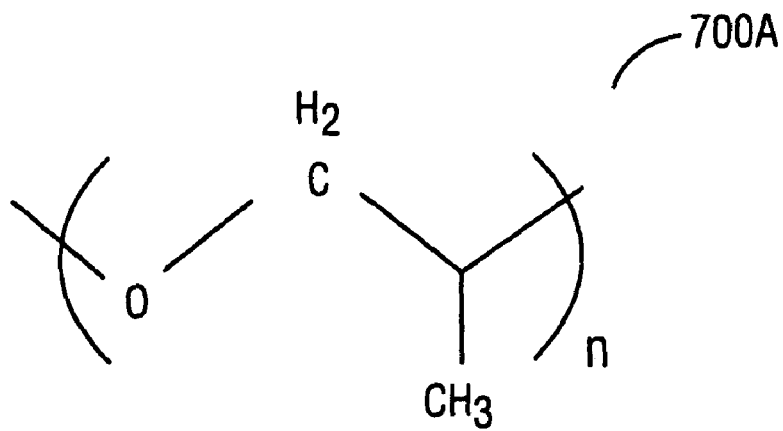
FIGS. 7A and 7B illustrate alternative, exemplary backbone structures of polyether-based resin indicating suitability as a binder matrix for PSH TIMs.
Figure 7B:
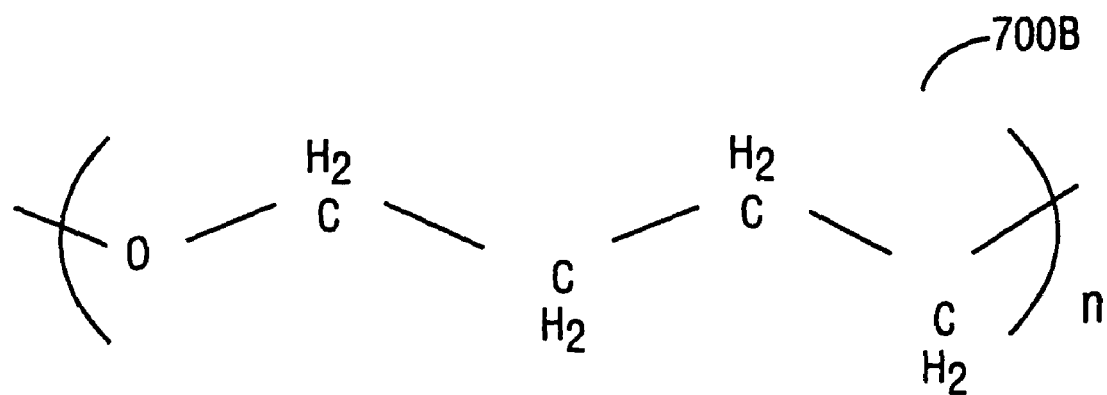

Polyether-based resin is another resin type that likewise exhibits desirable characteristics for application as a PSH TIM. FIGS. 7A and 7B illustrate alternative, exemplary backbone structures of polyether-based resin, 700A and 700B, respectively, indicating suitability as a binder matrix for PSH TIMs.

Polyethers are relatively inexpensive, amorphous, and can be designed to have low moisture absorbency. Polyethers, too, can be made cross-linkable or non-cross-linkable and are easily controllable with respect to polymerization.

Urethanes

Urethanes with a NHCOO linkage are elastomeric materials that likewise exhibits desirable characteristics for application as a PSH TIM. Urethanes, in addition to low glass transition temperature and low moisture absorbency are especially robust. Moreover, urethanes are flexible in application in that texture and hardness may be easily adjusted by varying the particular monomers used.

General Matters

Binder matrix polymers, as discussed above, provide one or more desirable characteristics for use as PSH TIMs. These characteristics include low glass transition temperature to provide more uniform heat dissipation, low moisture absorbency to avoid interface degradation, as well as better adhesion and lower contact resistance. Additionally, the alternative binder matrix materials may provide a less expensive more robust material that performs better than typical prior art binder matrix materials.

Figure 8:
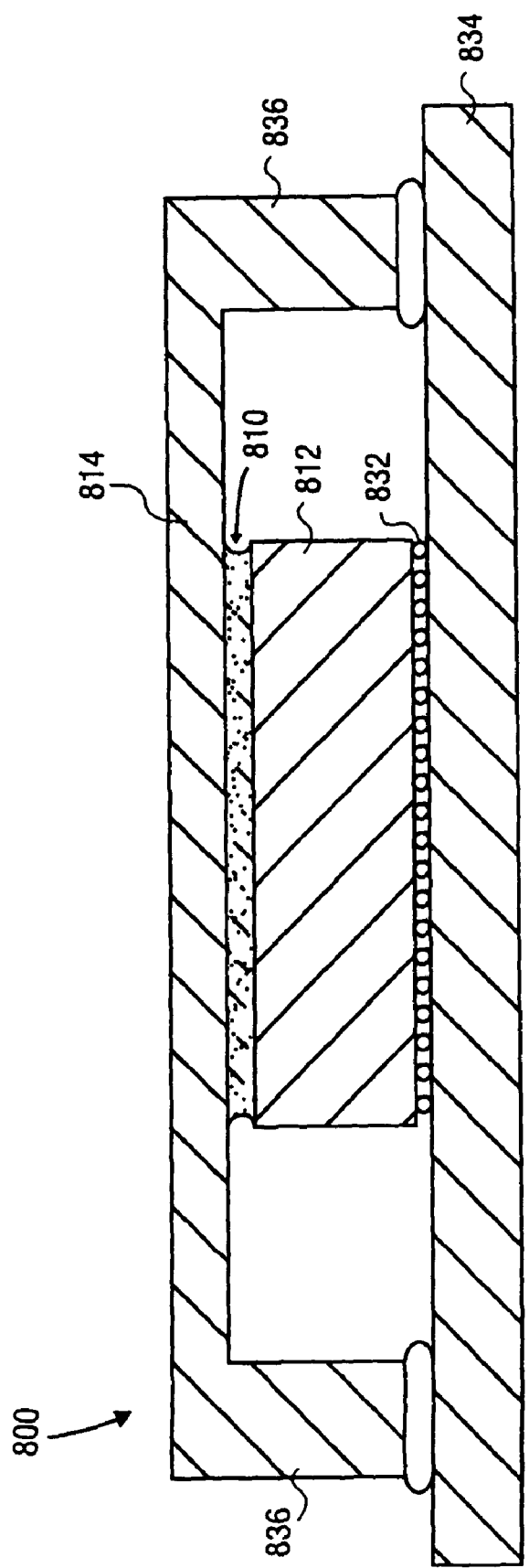
FIG. 8 illustrates an assembly employing an alternative binder matrix material in a PSH TIM in accordance with one embodiment of the invention.

FIG. 8 illustrates an assembly employing an alternative binder matrix material in a PSH TIM in accordance with one embodiment of the invention. Assembly 800 includes an electronic component 812, the thermally conductive member 814, and the PSH TIM 810. The electronic component 812 is a semiconductor die (hereafter referred to as "die 812") having an integrated circuit formed in and on a lower surface thereof. Solder bump contacts 832 are formed on the integrated circuit. The assembly 800 further includes a package substrate 834 having contact pads (not shown) on an upper surface thereof. Each contact 832 is located on a respective contact pad. The combination of the package substrate 834 and the die 812 is then inserted into a furnace so that the contacts 832 melt, and is then cooled so that the contacts 832 secure the die 812 to the package substrate 834.

The thermally conductive member 814 is made of metal or ceramic and forms part of a metal cap having sides 836 extending downwardly from edges of the thermally conductive member 814, past the die 812, to the substrate 834. The thermal interface material 810 is in the form shown in FIG. 3 when the cap is located over the die 812. Only then is the assembly 800 placed in a furnace so as to transform the thermal interface material 810 into the form shown in FIG. 4.

While the invention has been described in terms of several embodiments, those skilled in the art will recognize that the invention is not limited to the embodiments described, but can be practiced with modification and alteration within the spirit and scope of the appended claims. For example, though described above in reference to heat removal from a microelectronic device, various embodiments of the invention may be implemented in a wide variety of heat removal applications (e.g., automotive and optical chips). The description is thus to be regarded as illustrative instead of limiting.

What is claimed is:

1. A method comprising:
    using a thermal interface material to thermally couple a die to a thermally conductive member, the thermal interface material having a polymeric matrix material selected from the group consisting; of phosphozene resin and perfluoro ether resin, fusible particles within the matrix material, the fusible particles having a melting point below a specified temperature and non-fusible particles in the matrix material, the non-fusible particles having a melting point above the specified temperature;
    subjecting the thermal interface material to a temperature above the specified temperature such that the fusible particles melt and agglomerate forming heat conduction paths.

2. The method of claim 1 wherein the matrix material is cross-linkable.

3. The method of claim 2 further comprising:
    curing the matrix material such that cross-linking occurs.

* * * * *